United States Patent [19]

Hayes

[11] Patent Number: 5,703,363
[45] Date of Patent: Dec. 30, 1997

[54] INFRARED TO VISIBLE LIGHT IMAGE CONVERSION DEVICE

[75] Inventor: Robert S. Hayes, Lawndale, Calif.

[73] Assignee: HE Holdings, Inc., Los Angeles, Calif.

[21] Appl. No.: 638,006

[22] Filed: Apr. 25, 1996

[51] Int. Cl.$^6$ .............. G01J 5/20; H01L 31/14; H01L 31/147
[52] U.S. Cl. ............ 250/332; 250/330; 250/484.2
[58] Field of Search .................. 250/332, 338.4, 250/370.08, 370.12, 484.2, 330

[56] References Cited

U.S. PATENT DOCUMENTS

| | | |
|---|---|---|
| 2,929,934 | 3/1960 | Nicoll .................. 250/330 |
| 4,205,227 | 5/1980 | Reed ................... 250/330 |
| 5,036,197 | 7/1991 | Voles .................. 250/332 |
| 5,332,899 | 7/1994 | Wolny et al. ........... 250/332 |

*Primary Examiner*—Edward J. Glick
*Attorney, Agent, or Firm*—Gordon R. Lindeen, III; Michael W. Sales; Wanda K. Denson-Low

[57] ABSTRACT

An image conversion device (14) comprising a detector (38) for detecting an infrared image and an image converter (40) for converting the infrared image to a visible image. The detector (38) and the image converter (40) are disposed on a single substrate. The detector (38) includes an array of multiple quantum well detectors (38) formed of GaAs or GaAlAs. The image converter (40) includes an array of light emitting diodes formed of GaAsP deposited on the array of multiple quantum well detectors (38). A photoemissive surface (28) is formed on the array of light emitting diodes (40) and a phosphor screen (30) displays the visible image.

16 Claims, 2 Drawing Sheets

INFRARED TO VISIBLE LIGHT IMAGE CONVERSION DEVICE

BACKGROUND OF THE INVENTION

1. Field of the Invention

The present invention relates to image conversion systems. More specifically, the present invention relates to infrared to visible light image conversion systems.

While the present invention is described herein with reference to illustrative embodiments for particular applications, it should be understood that the invention is not limited thereto. Those having ordinary skill in the an and access to the teachings provided herein will recognize additional modifications, applications, and embodiments within the scope thereof and additional fields in which the present invention would be of significant utility.

2. Description of the Related Art

Infrared to visible light image conversion systems are used in thermal sights for armored vehicles and small weapons and in night driving devices. Present infrared to visible light image conversion systems operate by convening an infrared signal to a scanned image which is then convened into a visible image. Current image conversion systems use either scanned or staring columns of infrared detectors or staring arrays of infrared detectors followed by electronic processing. The detected image is then electronically read out, processed, and convened back into an optical image. The optical image is typically formed by either a scanned light emitting diode array or a cathode ray tube.

Unfortunately, the external electronic circuitry required to convert the infrared image to a visible image occupies most of the space and consumes most of the power in present systems. Thus, there is a need in the art for a smaller, less complex infrared to visible light conversion device which requires no external processing.

SUMMARY OF THE INVENTION

The need in the art is addressed by the image conversion device of the present invention, which provides a smaller, less complex infrared to visible light conversion requiring no external processing. The inventive device includes an infrared detector and an infrared to visible image converter on the same substrate. In specific embodiments, the detector includes an array of multiple quantum well detectors based on gallium arsenide (GaAs) and related materials and the image converter includes an array of light emitting diodes also formed of GaAs and related materials deposited on the array of multiple quantum well detectors. A photoemissive surface may be formed on the array of light emitting diodes and a phosphor screen used to display the visible image or the light emitting diode array can directly display a visible image.

DESCRIPTION OF THE INVENTION

The image conversion device of the present invention is suitable for use in thermal sights for armored vehicles, thermal sights for small arms, and night driving devices.

Figure 1:
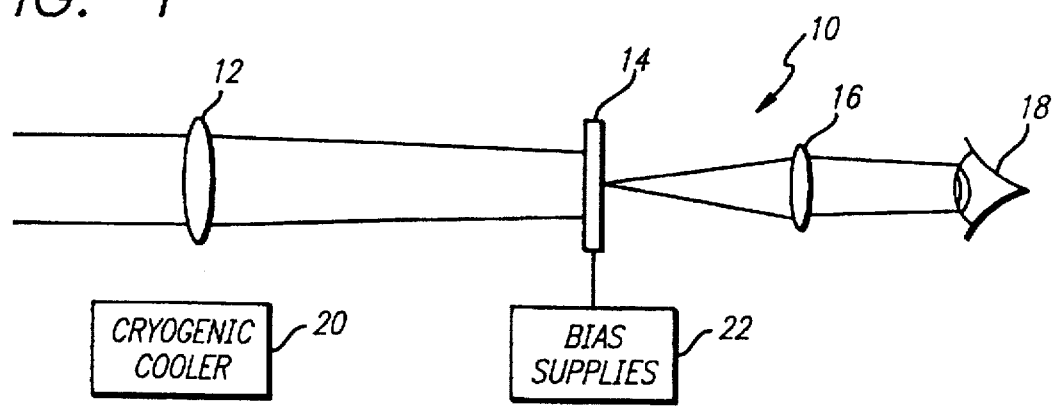
FIG. 1 is a cross-sectional view of a first embodiment of an image conversion system of the present invention.

FIG. 1 shows a first embodiment of an image conversion system 10 of the present invention. An objective 12 is an imaging lens, or may be a mirror and lens combination. A suitable objective 12 would have a focal length of one to two inches, with an f-number of one. A detector/emitter array 14 is fabricated as a monolithic assembly with the emitters 14 fabricated by substrate deposition of successive layers of semiconductor materials such as GaAs and gallium aluminum arsenide (GaAlAs) to detect infrared energy, and other semiconductor materials such as GaAs, GaAsP or GaP to emit visible light. An ocular 16 is a lens which may be similar to the objective 12 if a one-to-one magnification is desired, or have a shorter focal length than the objective 12 if magnification is required. A suitable ocular 16, such as a telescope eyepiece, would have a focal length of one to two inches, with an f-number of two or three, for comfortable viewing by a human eye 18. A cryogenic cooler 20 of standard design maintains the detector/emitter array 14 at its proper operating temperature. The bias supplies 22 which provide bias to the detector/emitter array 14 are low voltage, under 10 volts. The embodiment of the image conversion system 10 depicted in FIG. 1 has overall quantum efficiency considerably less than one.

Figure 2:
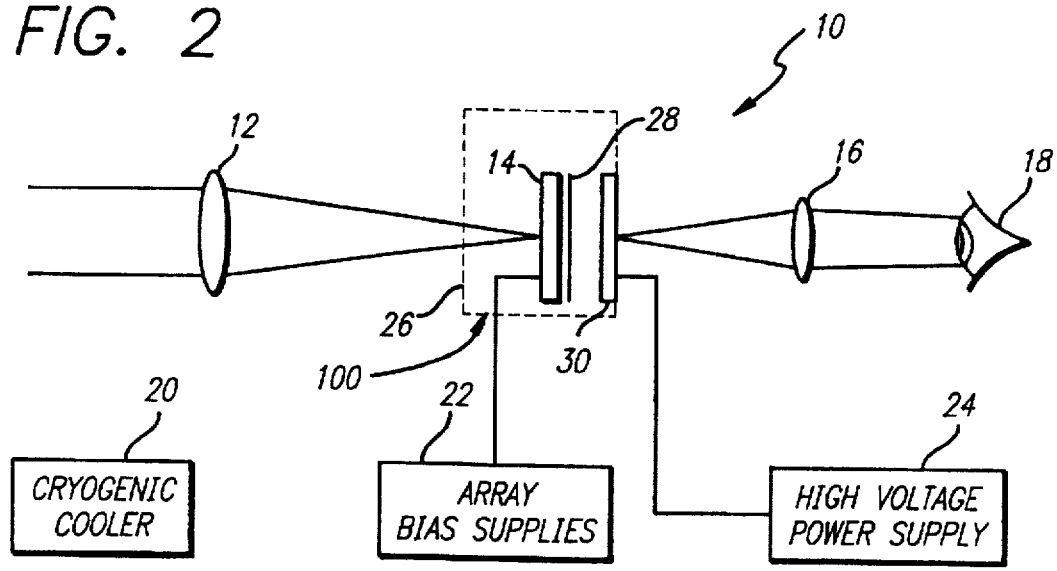
FIG. 2 is a cross-sectional view of a second embodiment of the image conversion system of the present invention.

FIG. 2 depicts a second embodiment of the image conversion system 10 which includes an image conversion device 100 of the present invention. The objective 12, the ocular 16, the cryogenic cooler 20, and the array bias supplies 22 are as described above. To improve quantum efficiency, the emitters 14 are fabricated of GaAs, which emits in the near infrared region. The detector/emitter array 14 is also coated with a photoemissive surface 28 such as silver cesium oxide (S1), formed by the vacuum deposition of cesium and silver which are oxidized in a vacuum under heat or by sputtering. Other photoemissive surfaces can also be used. A vacuum envelope 26 surrounds the detector/emitter array 14, the photoemissive surface 28 and a phosphor screen 30. A high voltage power supply 24 is a high voltage source, in the 1000 to 2000 volt range, for accelerating photoelectrons emitted by the photoemissive surface 28 adjacent to the detector/emitter array 14. The phosphor screen 30 is positioned to receive accelerated photoelectrons and is capable of emitting visible light which can be detected by the eye 18. This embodiment provides an improvement in quantum efficiency over the first embodiment of the image conversion system 10 depicted in FIG. 1, since the GaAs emitter 14 is more efficient and the phosphor screen 30 is capable of emitting several photons for each incident electron.

Figure 3:
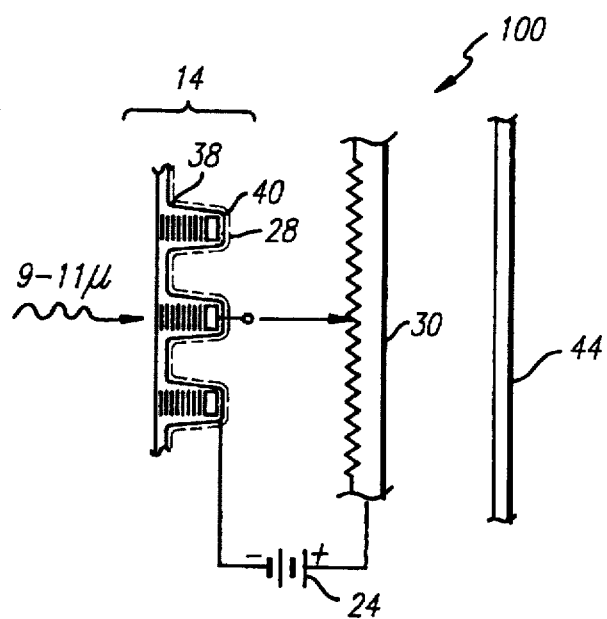
FIG. 3 is a cross-sectional view of an image conversion device of the present invention.

FIG. 3 depicts in greater detail the image conversion device 100 of the present invention. An array of detectors/emitters 14 is formed on a GaAs substrate 36 by depositing successive layers of GaAs and GaAlAs or other suitable materials. The lower layers form multiple quantum well detectors 38 tuned to the 9 to 11 micron or 3 to 5 micron region. The upper layers form GaAs or GaAsP light emitting diodes 40 capable of emitting in the 0.6 to 1 micron range, within the near infrared or visible spectral region. The photoemissive surface 28 sensitive to this spectral range is deposited over the light emitting diodes 40. A silver substrate 46 is formed next, with the photoemissive surface 28 deposited thereon. The accelerating voltage 24 is provided to accelerate electrons from the photoemissive surface 28 onto the phosphor screen 30, which is formed on a glass substrate 44. The detectors/emitters 14 and phosphor screen 30 are enclosed in vacuum envelope 26 and cooled to cryogenic temperatures by cryogenic cooler 20.

Figure 4:
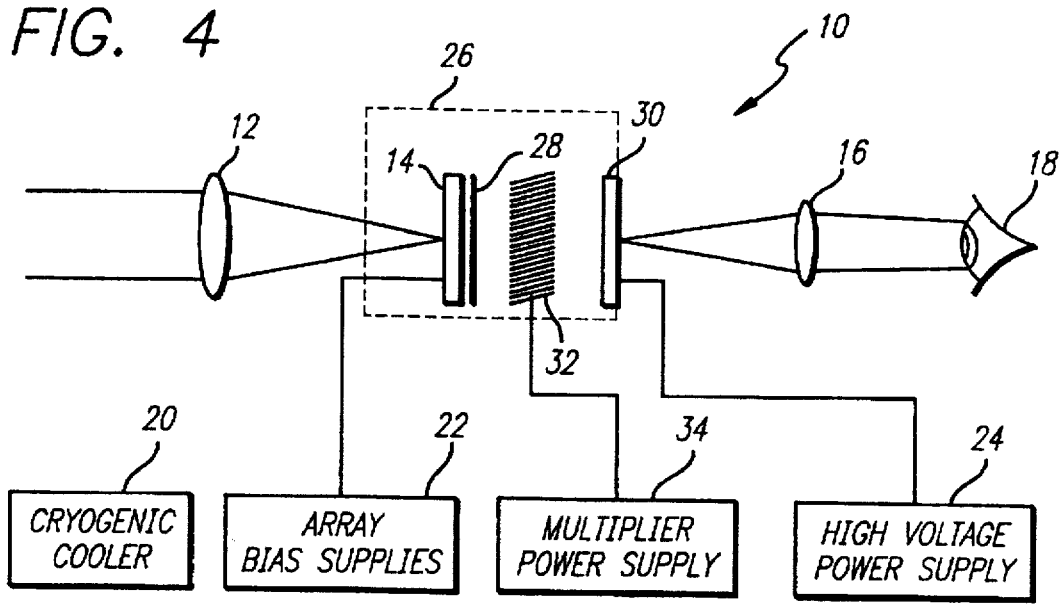
FIG. 4 is a cross-sectional view of a third embodiment of the image conversion system of the present invention.

FIG. 4 depicts a third embodiment of the image conversion system 10 of the present invention. The objective 12, the detector/emitter array 14, the ocular 16, the cryogenic cooler 20, the array bias supplies 22, the high voltage power supply 24, the vacuum envelop 26, the photoemissive surface 28, and the phosphor screen 30 are as described above. Sensitivity is further increased by inclusion of an electron multiplier 32 of the microchannel type between the photoemissive surface 28 and the phosphor screen 30. The electron multiplier 32 is powered by a multiplier power supply 34 which is a high voltage source, in the 1000 to 2000 volt range.

The operation of the present invention is explained with further reference to FIG. 3. Photons in the 9 to 11 micron range are focused through the GaAs substrate 36 onto the array of multiple quantum well detectors 38. The excited electrons in each detector are transferred to light emitting diodes 40. The photons emitted by the light emitting diodes 40 are absorbed by the photoemissive surface 28 which emits photoelectrons into vacuum envelope 26. The photoelectrons are accelerated by accelerating voltage 24 into the phosphor screen 30 to provide a visible image.

Figure 5:
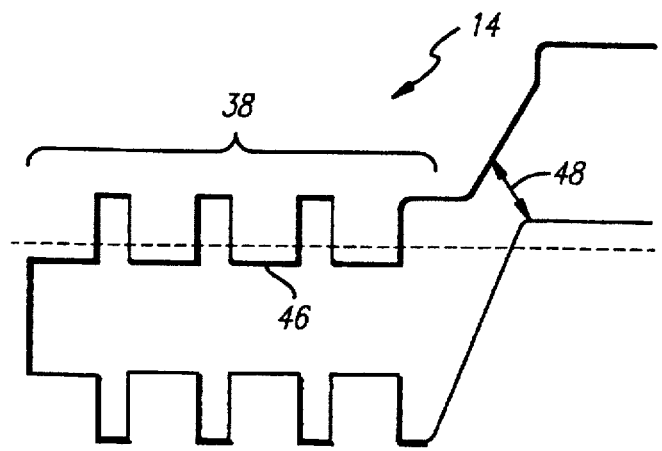
FIG. 5 is a cross-sectional view of an unbiased band structure of the image conversion device of the present invention.
Figure 6:
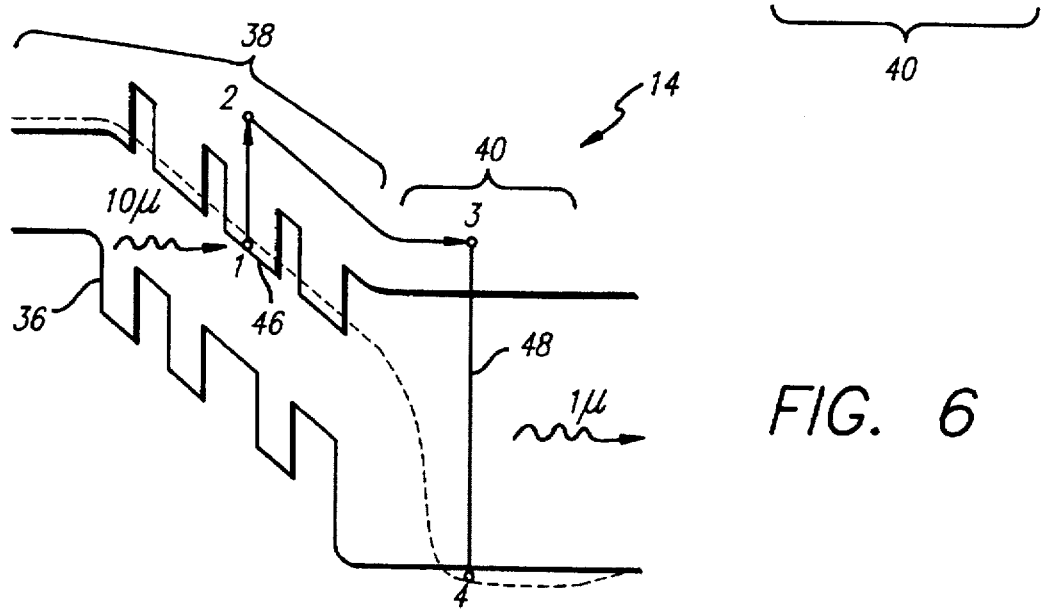
FIG. 6 is a cross-sectional view of a biased band structure of the image conversion device of the present invention.

FIG. 5 shows the composition and band structure of the detector/emitters 14 with no bias applied. FIG. 6 shows the composition and band structure of the detector/emitters 14 with bias applied. A 10 micron photon enters through the GaAs substrate 36 and is absorbed by an electron in one of the quantum wells 38 (1). The photon excites the electron to a level above the well 38 barriers (transition from 1 to 2). The electron is then moved by the bias potential to the light emitting diode region 40 (transition from 2 to 3). The electron then crosses the band gap 48 to occupy an empty state below the band gap 48 (transition from 3 to 4), and in the process emits a photon in the 0.6 to 1 micron range, depending on the band gap. This photon is used to stimulate a photoelectron as shown in FIG. 3. If sufficient 10 micron photons are present, the light emitting diode 40 can be arranged to emit in the visible region, and this image can be used directly without the photoemissive surface or phosphor screen.

The need in the art is thus addressed by the image conversion device of the present invention, which provides a smaller, less complex infrared to visible light conversion requiring no external processing.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. An image conversion device comprising:
   first means disposed on a substrate for detecting an infrared image, said first means including an array of multiple quantum well detectors; and
   second means disposed on said first means for converting the detected infrared image to a visible image, whereby said first means and said second means comprise a single monolithic assembly.

2. The invention of claim 1 wherein the array of multiple quantum well detectors is formed of GaAs and GaAlAs.

3. The invention of claim 2 wherein the converting means includes an array of light emitting diodes.

4. The invention of claim 3 wherein the array of light emitting diodes is formed of GaAsP deposited on the array of multiple quantum well detectors.

5. The invention of claim 4 further including a photoemissive surface formed on the array of light emitting diodes.

6. The invention of claim 5 further including a phosphor screen to display the visible image.

7. The invention of claim 6 further including an electron multiplier disposed between the photoemissive surface and the phosphor screen.

8. The invention of claim 1 wherein the output of the first means is input directly to the second means.

9. An image conversion device comprising:
   a monolithic array including quantum well detectors for detecting an infrared image and light emitting diodes disposed on and in contact with said detectors for converting the detected infrared image to a visible image.

10. The invention of claim 9 wherein the output of each detector is input directly to a light emitting diode.

11. An image conversion system comprising:
    means for receiving an infrared image;
    means adjacent to the receiving means for detecting the infrared image, said detecting means including an array of multiple quantum well detectors;
    means monolithic with the detecting means for converting the detected infrared image to a visible image; and
    means adjacent to the converting means for transmitting the visible image.

12. A method of fabricating an image conversion device, comprising the steps of:
    depositing layers of GaAs and GaAlAs on a GaAs substrate to form quantum well detectors; and
    depositing a layer of GaAsP on the layers of GaAs and GaAlAs to form light emitting diodes.

13. An image conversion device comprising:
    means disposed on a substrate for detecting an infrared image, the detecting means including an array of multiple quantum well detectors formed of GaAs and GaAlAs and
    means disposed on said substrate for converting the detected infrared image to a visible image including an array of light emitting diodes formed of GaAsP deposited on the array of multiple quantum well detectors.

14. The invention of claim 13 further including a photoemissive surface formed on the array of light emitting diodes.

15. The invention of claim 14 further including a phosphor screen to display the visible image.

16. The invention of claim 15 further including an electron multiplier disposed between the photoemissive surface and the phosphor screen.

* * * * *